US012676586B2

(12) United States Patent
Jachowski et al.

(10) Patent No.: US 12,676,586 B2
(45) Date of Patent: Jul. 7, 2026

---

(54) FILTER WITH MULTIPLE RESONATORS HAVING DIFFERENT PASSIVATION THICKNESS DISTRIBUTIONS

(71) Applicant: Murata Manufacturing Co., Ltd., Nagaokakyo (JP)

(72) Inventors: Doug Jachowski, Santa Cruz, CA (US); Bryant Garcia, Burlingame, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 316 days.

(21) Appl. No.: 18/177,380

(22) Filed: Mar. 2, 2023

(65) Prior Publication Data

US 2023/0283256 A1 Sep. 7, 2023

Related U.S. Application Data

(60) Provisional application No. 63/316,349, filed on Mar. 3, 2022.

(51) Int. Cl.
| | |
|---|---|
| *H03H 9/02* | (2006.01) |
| *H03H 9/205* | (2006.01) |
| *H03H 9/56* | (2006.01) |

(52) U.S. Cl.
CPC ........ H03H 9/02228 (2013.01); H03H 9/205 (2013.01); H03H 9/568 (2013.01)

(58) Field of Classification Search
CPC .... H03H 9/02228; H03H 9/568; H03H 9/562; H03H 9/564; H03H 9/205; H03H 9/02;
(Continued)

(56) References Cited

U.S. PATENT DOCUMENTS

| | | | |
|---|---|---|---|
| 5,705,399 | A | 1/1998 | Larue |
| 5,853,601 | A | 12/1998 | Krishaswamy et al. |

(Continued)

FOREIGN PATENT DOCUMENTS

| | | |
|---|---|---|
| CN | 1926763 A | 3/2007 |
| CN | 201893487 U | 7/2011 |

(Continued)

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

(Continued)

*Primary Examiner* — Andrea Lindgren Baltzell
*Assistant Examiner* — Victor Cole
(74) *Attorney, Agent, or Firm* — ArentFox Schiff LLP

(57) ABSTRACT

A filter device is provided that includes a substrate, a piezoelectric plate attached to the substrate; interdigital transducers (IDTs) of a plurality of resonators, respectively, that each have interleaved fingers at respective diaphragms of the one piezoelectric plate disposed over one or more cavities; and a dielectric layer over at least one surface of the respective diaphragms. For at least two resonators, the dielectric layer has a thickness distribution that includes a first thickness layer and a second thickness layer over the first thickness layer, and the second thickness layer of a first resonator of the at least two resonators has a coverage distribution over the first thickness layer that is different than a coverage distribution of a second resonator of the at least two resonators.

17 Claims, 11 Drawing Sheets

SECTION B-B

DETAIL C
FIG. 2

SECTION A-A

(58) Field of Classification Search

CPC .. H03H 9/15; H03H 9/54; H03H 9/64; H03H 9/02535; H03H 9/02574; H03H 9/131; H03H 9/132; H03H 9/171; H03H 9/02015; H03H 9/02614; H03H 9/02622; H03H 9/02086; H03H 2003/0421; H03H 2003/0442; H03H 2003/045

USPC ......................... 333/133, 186–188, 193–196

See application file for complete search history.

(56) References Cited

U.S. PATENT DOCUMENTS

| | | | |
|---|---|---|---|
| 6,540,827 B1 | 4/2003 | Levy et al. | |
| 6,707,229 B1 | 3/2004 | Martin | |
| 7,135,940 B2 | 11/2006 | Kawakubo et al. | |
| 7,463,118 B2 | 12/2008 | Jacobsen | |
| 7,535,152 B2 | 5/2009 | Ogami et al. | |
| 7,684,109 B2 | 3/2010 | Godshalk et al. | |
| 7,802,466 B2 | 9/2010 | Whalen et al. | |
| 7,868,519 B2 | 1/2011 | Umeda | |
| 8,099,853 B2 * | 1/2012 | Kando | H03H 3/08 |
| | | | 29/609.1 |
| 8,278,802 B1 | 10/2012 | Lee et al. | |
| 8,344,815 B2 | 1/2013 | Yamanaka | |
| 8,829,766 B2 | 9/2014 | Milyutin et al. | |
| 8,932,686 B2 | 1/2015 | Hayakawa et al. | |
| 9,130,145 B2 | 9/2015 | Martin et al. | |
| 9,219,466 B2 | 12/2015 | Meltaus et al. | |
| 9,276,557 B1 | 3/2016 | Nordquist et al. | |
| 9,369,105 B1 | 6/2016 | Li | |
| 9,425,765 B2 | 8/2016 | Rinaldi | |
| 9,525,398 B1 | 12/2016 | Olsson | |
| 9,748,923 B2 | 8/2017 | Kando et al. | |
| 9,780,759 B2 | 10/2017 | Kimura et al. | |
| 10,200,013 B2 | 2/2019 | Bower et al. | |
| 10,305,447 B2 | 5/2019 | Raihn et al. | |
| 10,491,192 B1 | 11/2019 | Plesski et al. | |
| 10,601,392 B2 | 3/2020 | Plesski et al. | |
| 10,637,438 B2 | 4/2020 | Garcia et al. | |
| 10,756,697 B2 | 8/2020 | Plesski et al. | |
| 10,790,802 B2 | 9/2020 | Yantchev et al. | |
| 10,797,675 B2 | 10/2020 | Plesski | |
| 10,826,462 B2 | 11/2020 | Plesski et al. | |
| 10,868,513 B2 | 12/2020 | Yantchev | |
| 10,985,728 B2 | 4/2021 | Plesski et al. | |
| 11,374,549 B2 * | 6/2022 | Yantchev | H03H 3/04 |
| 11,916,540 B2 | 2/2024 | Yantchev | |
| 2002/0079986 A1 | 6/2002 | Ruby et al. | |
| 2002/0158714 A1 | 10/2002 | Kaitila et al. | |
| 2003/0199105 A1 | 10/2003 | Kub et al. | |
| 2004/0041496 A1 | 3/2004 | Imai et al. | |
| 2004/0090145 A1 | 5/2004 | Bauer et al. | |
| 2004/0207033 A1 | 10/2004 | Koshido | |
| 2004/0207485 A1 | 10/2004 | Kawachi et al. | |
| 2004/0261250 A1 | 12/2004 | Kadota et al. | |
| 2005/0280476 A1 | 12/2005 | Abe et al. | |
| 2006/0072875 A1 | 4/2006 | Bhagavatula et al. | |
| 2006/0125489 A1 | 6/2006 | Feucht et al. | |
| 2006/0131731 A1 | 6/2006 | Sato | |
| 2006/0152107 A1 | 7/2006 | Tanaka | |
| 2006/0222568 A1 | 10/2006 | Wang et al. | |
| 2007/0001549 A1 | 1/2007 | Kando et al. | |
| 2007/0090898 A1 | 4/2007 | Kando | |
| 2007/0170565 A1 | 7/2007 | Hong et al. | |
| 2007/0188047 A1 | 8/2007 | Tanaka | |
| 2007/0194863 A1 | 8/2007 | Shibata et al. | |
| 2010/0064492 A1 | 3/2010 | Tanaka | |
| 2010/0102669 A1 | 4/2010 | Yamanaka | |
| 2010/0107388 A1 | 5/2010 | Iwamoto | |
| 2010/0123367 A1 | 5/2010 | Tai et al. | |
| 2010/0212127 A1 | 8/2010 | Heinze et al. | |
| 2010/0223999 A1 | 9/2010 | Onoe | |
| 2010/0301703 A1 | 12/2010 | Chen et al. | |
| 2011/0109196 A1 | 5/2011 | Goto | |
| 2011/0199163 A1 | 8/2011 | Yamanaka | |
| 2011/0278993 A1 | 11/2011 | Iwamoto | |
| 2013/0015353 A1 | 1/2013 | Tai et al. | |
| 2013/0021116 A1 | 1/2013 | Sogoya et al. | |
| 2013/0057360 A1 | 3/2013 | Meltaus et al. | |
| 2013/0321100 A1 | 12/2013 | Wang | |
| 2014/0001919 A1 | 1/2014 | Komatsu | |
| 2014/0009032 A1 | 1/2014 | Takahashi et al. | |
| 2014/0113571 A1 | 4/2014 | Fujiwara | |
| 2014/0145556 A1 | 5/2014 | Kadota | |
| 2014/0151151 A1 | 6/2014 | Reinhardt | |
| 2014/0152145 A1 | 6/2014 | Kando et al. | |
| 2014/0173862 A1 | 6/2014 | Kando et al. | |
| 2014/0218129 A1 | 8/2014 | Fujiwara | |
| 2014/0225684 A1 | 8/2014 | Kando et al. | |
| 2014/0312994 A1 | 10/2014 | Meltaus et al. | |
| 2015/0070227 A1 | 3/2015 | Kishino et al. | |
| 2015/0234805 A1 | 8/2015 | Caswell | |
| 2015/0319537 A1 | 11/2015 | Perois et al. | |
| 2015/0333730 A1 | 11/2015 | Meltaus | |
| 2016/0028367 A1 | 1/2016 | Shealy | |
| 2016/0182009 A1 | 6/2016 | Bhattacharjee | |
| 2016/0285430 A1 | 9/2016 | Kikuchi et al. | |
| 2017/0005638 A1 | 1/2017 | Otagawa et al. | |
| 2017/0063332 A1 | 3/2017 | Gilbert et al. | |
| 2017/0077902 A1 | 3/2017 | Daimon | |
| 2017/0104470 A1 | 4/2017 | Koelle et al. | |
| 2017/0179928 A1 | 6/2017 | Raihn et al. | |
| 2017/0187352 A1 | 6/2017 | Omura | |
| 2017/0214387 A1 | 7/2017 | Burak et al. | |
| 2017/0222618 A1 | 8/2017 | Inoue et al. | |
| 2017/0222622 A1 | 8/2017 | Solal et al. | |
| 2017/0264263 A1 | 9/2017 | Huang et al. | |
| 2017/0324394 A1 | 11/2017 | Ebner et al. | |
| 2017/0359050 A1 | 12/2017 | Irieda et al. | |
| 2017/0370791 A1 | 12/2017 | Nakamura et al. | |
| 2018/0062604 A1 | 3/2018 | Koskela et al. | |
| 2018/0123016 A1 | 5/2018 | Gong et al. | |
| 2018/0152169 A1 | 5/2018 | Goto et al. | |
| 2018/0191322 A1 | 7/2018 | Chang et al. | |
| 2019/0068164 A1 | 2/2019 | Houlden et al. | |
| 2019/0123721 A1 | 4/2019 | Takamine | |
| 2019/0131953 A1 | 5/2019 | Gong | |
| 2019/0148621 A1 | 5/2019 | Feldman et al. | |
| 2019/0181833 A1 | 6/2019 | Nosaka | |
| 2019/0245518 A1 | 8/2019 | Ito | |
| 2019/0273480 A1 | 9/2019 | Lin | |
| 2019/0273481 A1 | 9/2019 | Michigami | |
| 2019/0363694 A1 * | 11/2019 | Song | H03H 9/542 |
| 2019/0386635 A1 | 12/2019 | Plesski et al. | |
| 2019/0386637 A1 | 12/2019 | Plesski et al. | |
| 2019/0386638 A1 | 12/2019 | Kimura et al. | |
| 2020/0007110 A1 | 1/2020 | Konaka et al. | |
| 2020/0021271 A1 | 1/2020 | Plesski et al. | |
| 2020/0091893 A1 | 3/2020 | Plesski et al. | |
| 2020/0162052 A1 | 5/2020 | Matsuoka et al. | |
| 2020/0212876 A1 * | 7/2020 | Goto | H03H 9/02228 |
| 2020/0220522 A1 | 7/2020 | Nosaka | |
| 2020/0228087 A1 | 7/2020 | Michigami et al. | |
| 2020/0304091 A1 | 9/2020 | Yantchev | |
| 2020/0328728 A1 | 10/2020 | Nakagawa et al. | |
| 2020/0336130 A1 | 10/2020 | Turner | |
| 2020/0373907 A1 | 11/2020 | Garcia | |
| 2021/0006228 A1 | 1/2021 | Garcia | |
| 2021/0013859 A1 | 1/2021 | Turner et al. | |
| 2021/0013868 A1 | 1/2021 | Plesski | |
| 2021/0044272 A1 * | 2/2021 | Yantchev | H03H 9/02228 |
| 2021/0126619 A1 | 4/2021 | Wang et al. | |
| 2021/0273631 A1 | 9/2021 | Jachowski et al. | |
| 2021/0384885 A1 | 12/2021 | Daimon et al. | |
| 2022/0103159 A1 * | 3/2022 | Shin | H03H 3/02 |
| 2022/0103160 A1 | 3/2022 | Jachowski | |
| 2022/0216842 A1 | 7/2022 | Nagatomo et al. | |
| 2022/0231661 A1 | 7/2022 | McHugh | |

FOREIGN PATENT DOCUMENTS

| | | |
|---|---|---|
| CN | 112352382 A | 2/2021 |
| DE | 112011100580 T5 | 1/2013 |
| JP | H0522074 A | 1/1993 |

(56)                    References Cited

FOREIGN PATENT DOCUMENTS

| JP | H10209804 A | 8/1998 |
|----|-------------|--------|
| JP | 2001244785 A | 9/2001 |
| JP | 2002300003 A | 10/2002 |
| JP | 2003078389 A | 3/2003 |
| JP | 2004096677 A | 3/2004 |
| JP | 2004129222 A | 4/2004 |
| JP | 2004304622 A | 10/2004 |
| JP | 2006173557 A | 6/2006 |
| JP | 2007251910 A | 9/2007 |
| JP | 2010103803 A | 5/2010 |
| JP | 2010109949 A | 5/2010 |
| JP | 2010233210 A | 10/2010 |
| JP | 2013528996 A | 7/2013 |
| JP | 2015054986 A | 3/2015 |
| JP | 2016001923 A | 1/2016 |
| JP | 2017220910 A | 12/2017 |
| JP | 2018166259 A | 10/2018 |
| JP | 2018207144 A | 12/2018 |
| JP | 2019186655 A | 10/2019 |
| JP | 2020088459 A | 6/2020 |
| JP | 2020113939 A | 7/2020 |
| WO | 2010047114 A1 | 4/2010 |
| WO | 2013021948 A1 | 2/2013 |
| WO | 2015098694 A1 | 7/2015 |
| WO | 2015156232 A1 | 10/2015 |
| WO | 2015182521 A1 | 12/2015 |
| WO | 2016017104 A1 | 2/2016 |
| WO | 2016052129 A1 | 4/2016 |
| WO | 2016147687 A1 | 9/2016 |
| WO | 2018003273 A1 | 1/2018 |
| WO | 2018079522 A1 | 5/2018 |
| WO | 2018163860 A1 | 9/2018 |
| WO | 2019138810 A1 | 7/2019 |
| WO | 2019241174 A1 | 12/2019 |
| WO | 2020092414 A2 | 5/2020 |
| WO | 2020175234 A1 | 9/2020 |
| WO | 2021060523 A1 | 4/2021 |
| WO | 2023002858 A1 | 1/2023 |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate MEMS Resonators With High Fom of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi: 10.1002/ecja.4410690406.

Naumenko et al., "Optimal orientations of Lithium Niobate for resonator SAW filters", 2003 IEEE Ultrasonics Symposium—pp. 2110-2113. (Year: 2003).

Webster Dictionary "Meaning of diaphragm" Merriam Webster since 1828.

Safari et al. "Piezoelectric for Transducer Applications" published by Elsevier Science Ltd., pp. 4 (Year: 2000).

Moussa et al. Review on Triggered Liposomal Drug Delivery with a Focus on Ultrasound 2015, Bentham Science Publishers, pp. 16 (Year 2005).

"Acoustic Properties of Solids" ONDA Corporation, 592 Weddell Drive, Sunnyvale, CA 94089, Apr. 11, 2003, pp. 5 (Year 2003).

Bahreynl, B., "Fabrication and Design of Resonant Microdevices" Andrew William, Inc. 2018, NY (Year 2008).

Material Properties of Tibtech Innovations, © 2018 TIBTECH Innovations (Year 2018).

Bousquet, Marie e al. "Single-mode high frequency LiNbO3 Film Bulk Acoustic Resonator," 2019 IEEE International Ultrasonics Symposium (IUS), Glasgow, Scotland, Oct. 6-9, 2019, pp. 84-87.

Wikipedia contributors, "Quartz crystal microbalance," Wikipedia, The Free Encyclopedia, https://en.wikipedia.org/w/index.php?title=Quartz_crystal_microbalance&oldid=1009990186 (accessed Apr. 9, 2021).

Yantchev, Ventsislav & Katardjiev, Ilia. (2013). Thin film Lamb wave resonators in frequency control and sensing applications: A review. Journal of Micromechanics and Microengineering. 23. 043001. 10.1088/0960-1317/23/4/043001.

Wei Pang et al. "Analytical and experimental study on the second harmonic mode response of a bulk acoustic wave resonator" 2010 J. Micromech. Microeng. 20 115015; doi: 10.1088/0960-1317/20/11/115015.

Durmus et al. "Acoustic-Based Biosensors" Encyclopedia of Microfluidics and Nanofluidics. DOI 10.1007/978-3-642-27758-0_10-2 Springer Science+Business Media New York 2014.

USPTO/ISA, International Search Report and Written Opinion for PCT Application No. PCT/US2023/017732 dated Jul. 27, 2023.

USPTO/ISA, International Search Report and Written Opinion for PCT Application No. PCT/US2022/082421 dated May 3, 2023.

USPTO/ISA, International Search Report and Written Opinion for PCT Application No. PCT/US2022/081095 dated May 30, 2023.

USPTO/ISA, International Search Report and Written Opinion for PCT Application No. PCT/US2022/079236 dated Mar. 10, 2023.

USPTO/ISA, International Search Report and Written Opinion for PCT Application No. PCT/US2022/081068 dated Apr. 18, 2023.

USPTO/ISA, International Search Report and Written Opinion for PCT Application No. PCT/US2022/080246 dated Mar. 30, 2023.

Gong et al.,"Design and Analysis of Lithium-Niobate-Based High Electromechanical Coupling RF-MEMS Resonators for Wideband Filtering", IEEE Transactions on Microwave Theory and Techniques, vol. 61, No. 1, Jan. 2013, pp. 403-413.

* cited by examiner

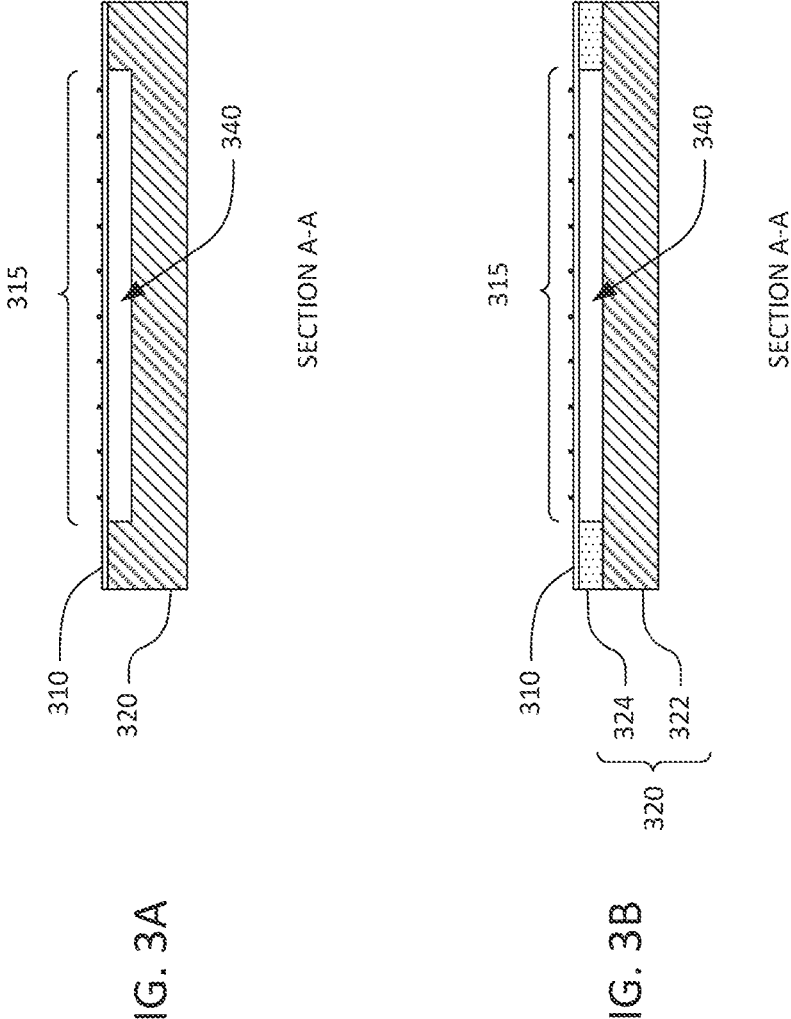

FILTER WITH MULTIPLE RESONATORS HAVING DIFFERENT PASSIVATION THICKNESS DISTRIBUTIONS

CROSS REFERENCE TO RELATED APPLICATIONS

The current application claims priority to U.S. Patent Provisional Application No. 63/316,349, filed Mar. 3, 2022, the entire contents of which is hereby incorporated by reference.

TECHNICAL FIELD

This disclosure relates to radio frequency filters using acoustic wave resonators, and specifically to filters for use in communications equipment.

BACKGROUND

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band may depend on the specific application. For example, in some cases a "pass-band" may be defined as a frequency range where the insertion loss of a filter is better than a defined value such as 1 dB, 2 dB, or 3 dB, while a "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels. As the demand for RF filters operating at higher frequencies continues to increase, there is a need for improved filters that can operate at different frequency bands while also improving the manufacturing processes for making such filters.

SUMMARY

Thus, according to an exemplary aspect, a filter device is provided that includes a substrate having a surface; at least one piezoelectric plate attached to the substrate; a plurality of interdigital transducers (IDTs) of a plurality of resonators, respectively, that each have interleaved fingers at respective diaphragms of the at least one piezoelectric plate disposed over one or more cavities; and at least one dielectric layer over at least one surface of the respective diaphragms of the at least one piezoelectric plate. Moreover, according to the exemplary aspect, for at least two resonators of the plurality of resonators, the at least one dielectric layer has a thickness distribution that includes a first thickness layer and a second thickness layer over the first thickness layer, and the second thickness layer of a first resonator of the at least two resonators has a coverage distribution over the first thickness layer that is different than a coverage distribution over the first thickness layer of a second resonator of the at least two resonators.

According to an exemplary aspect, a filter device is provided that includes a substrate having a surface; at least one piezoelectric plate attached to the substrate; a plurality of interdigital transducers (IDTs) of a plurality of resonators, respectively, that each have interleaved fingers at respective diaphragms of the at least one piezoelectric plate disposed over one or more cavities; and at least one dielectric layer over at least one surface of the respective diaphragms of the at least one piezoelectric plate. In this aspect, the at least one dielectric layer of at least one first resonator of the plurality of resonators has a thickness distribution that includes a dielectric base having a uniform distribution and a first dielectric pattern on the dielectric base, the at least one dielectric layer of at least one second resonator of the plurality of resonators has a thickness distribution that includes a dielectric base having a uniform distribution and a second dielectric pattern on the dielectric base, and the first dielectric pattern is different than the second dielectric pattern.

According to another exemplary aspect, a resonator is provided that includes a substrate having a surface; a piezoelectric plate attached to the substrate; an interdigital transducer (IDT) of a resonator having interleaved fingers at a diaphragm of the piezoelectric plate; and a continuous dielectric layer over the interleaved fingers of the IDT. In this aspect, the continuous dielectric layer has a thickness distribution that includes a dielectric base having a uniform distribution and a first dielectric pattern on the dielectric base. The above simplified summary of example aspects serves to provide a basic understanding of the present disclosure. This summary is not an extensive overview of all contemplated aspects, and is intended to neither identify key or critical elements of all aspects nor delineate the scope of any or all aspects of the present disclosure. Its sole purpose is to present one or more aspects in a simplified form as a prelude to the more detailed description of the disclosure that follows.

BRIEF DESCRIPTION OF THE DRAWINGS

The accompanying drawings, which are incorporated into and form a part of this specification, illustrate one or more example aspects of the present disclosure and, together with the detailed description, serve to explain their principles and implementations.

FIG. 3A is an alternative schematic cross-sectional view of the XBAR of FIG. 1.

FIG. 3B is an alternative schematic cross-sectional view of the XBAR of FIG. 1.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Figure 1:
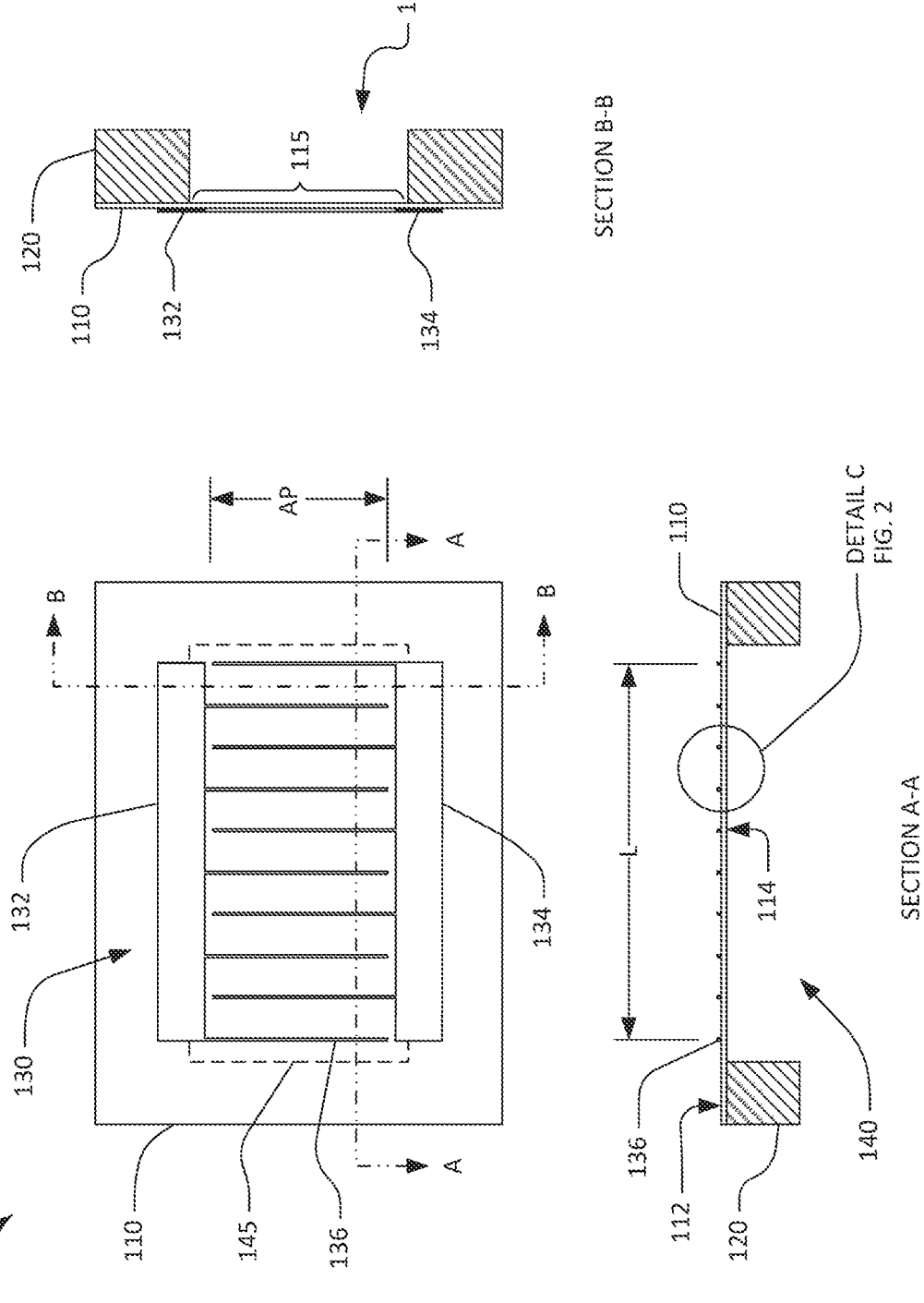
FIG. 1 includes a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators, such as the resonator 100, may be used in a variety of RF filters including band-reject filters, band-pass filters, duplexers, and multiplexers. XBARs are particularly suited for use in filters for communications bands with frequencies above 3 GHz.

In general, the XBAR 100 is made up of a thin film conductor pattern formed at one or both surfaces of a piezoelectric plate 110 having parallel front and back surfaces 112, 114, respectively (also referred to generally first and second surfaces, respectively). The piezoelectric plate is a thin single-crystal layer of a piezoelectric material, such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples described herein, the piezoelectric plates are Z-cut, which is to say the Z axis is normal to the front and back surfaces 112, 114. However, XBARs may be fabricated on piezoelectric plates with other crystallographic orientations including rotated Z-cut and rotated YX cut.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans (e.g., extends over) the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item".

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner.

"Cavity" has its conventional meaning of "an empty space within a solid body." The cavity 140 may be a hole completely through the substrate 120 (as shown in Section A-A and Section B-B) or a recess in the substrate 120 (as shown subsequently in FIG. 3A and FIG. 3B). The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

In the examples of FIG. 1, FIG. 3A. and FIG. 3B, the IDT 130 is on the front surface 112 (e.g., the first surface) of the piezoelectric plate 110. In other configurations, the IDT 130 may be on the back surface 114 (e.g., the second surface) of the piezoelectric plate 110 or on both the front and back surfaces 112, 114.

The first and second busbars 132, 134 are configured as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned at or on the piezoelectric plate 110 such that at least the fingers of the IDT 130 are extend at or on the diaphragm 115 of the piezoelectric plate that spans, or is suspended over, the cavity 140. As shown in FIG. 1, the cavity 140 has a rectangular cross section with an extent greater than the aperture AP and length L of the IDT 130. According to other exemplary aspects, the cavity of an XBAR may have a different cross-sectional shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT. For example, an XBAR may have hundreds, possibly thousands, of parallel fingers in the IDT according to exemplary aspects. Similarly, the thickness of the fingers in the cross-sectional views is greatly exaggerated.

Figure 2A:
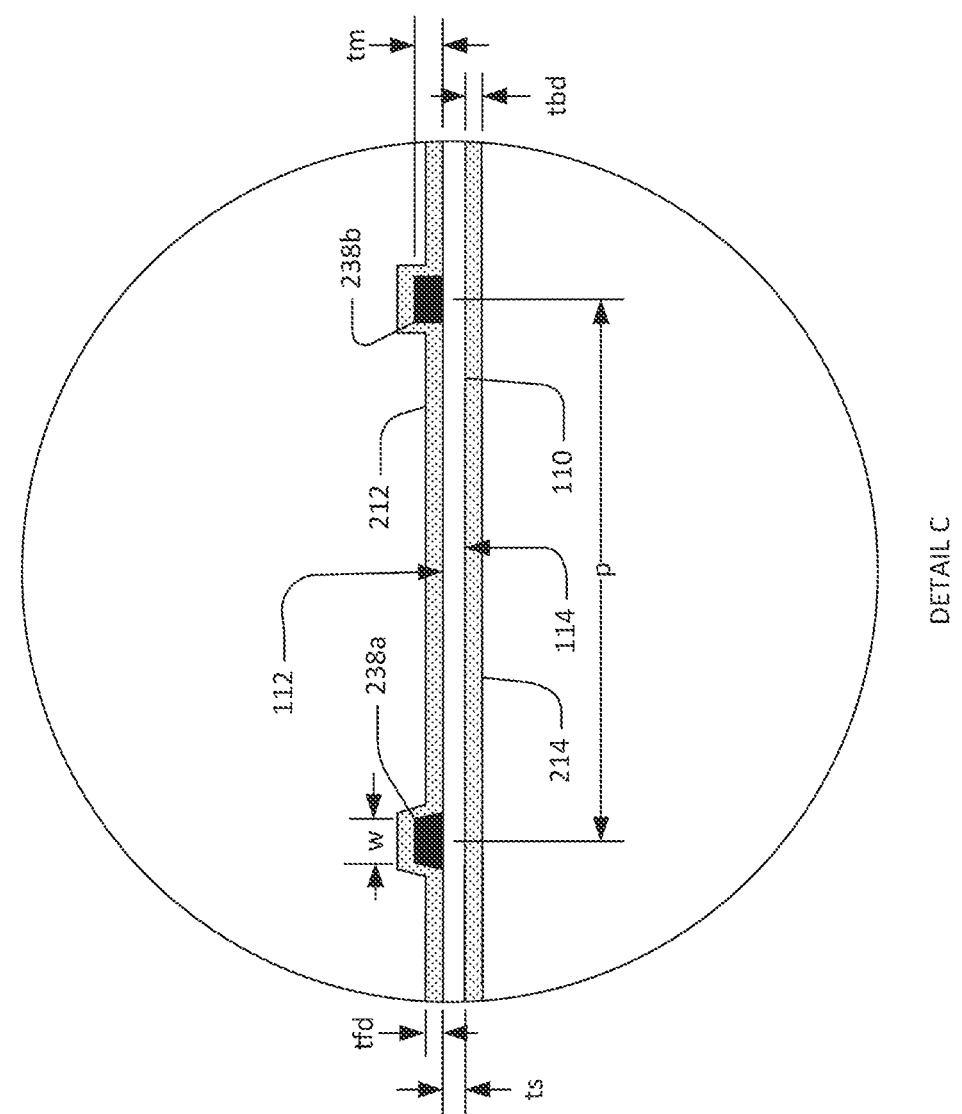
FIG. 2A is an expanded schematic cross-sectional view of a portion of the XBAR of FIG. 1.

FIG. 2A shows a detailed schematic cross-sectional view of the XBAR 100 of FIG. 1. The piezoelectric plate 110 is a single-crystal layer of piezoelectrical material having a thickness ts. ts may be, for example, 100 nm to 1500 nm. When used in filters for 5G NR and Wi-Fi™ bands from 3.4 GHZ to 7 GHz, the thickness ts may be, for example, 150 nm to 500 nm.

A front-side dielectric layer 212 (e.g., a first dielectric coating layer or material) can be formed on the front side 112 of the piezoelectric plate 110. The "front side" of the XBAR is, by definition, the surface facing away from the substrate. The front-side dielectric layer 212 has a thickness tfd. As shown in FIG. 2A the front-side dielectric layer 212 covers the IDT fingers 238*a*, 238*b*. Although not shown in FIG. 2A, the front side dielectric layer 212 may also be deposited only between the IDT fingers 238*a*, 238*b*. In this case, an additional thin dielectric layer (not shown) may be deposited over the IDT fingers to seal and passivate the fingers.

A back-side dielectric layer 214 (e.g., a second dielectric coating layer or material) can be formed on the back side 114 of the piezoelectric plate 110. In general, for purposes of this disclosure, the term "back-side" means on a side opposite the conductor pattern of the IDT structure and/or opposite the front-side dielectric layer 212. Moreover, the back-side dielectric layer 214 has a thickness tbd. The front-side and back-side dielectric layers 212, 214 may be a non-piezoelectric dielectric material, such as silicon dioxide or silicon nitride. tfd and tbd may be, for example, 0 to 500 nm. tfd and tbd are typically less than the thickness is of the piezoelectric plate. tfd and tbd are not necessarily equal, and the front-side and back-side dielectric layers 212, 214 are not necessarily the same material. Either or both of the front-side and back-side dielectric layers 212, 214 may be formed of multiple layers of two or more materials according to various exemplary aspects.

The IDT fingers 238*a*, 238*b* may be aluminum, substantially aluminum alloys, copper, substantially copper alloys, beryllium, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers. The cross-sectional shape of the IDT fingers may be trapezoidal (finger 238*a*), rectangular (finger 238*b*) or some other shape.

Figures 2B, 2C, 2D:
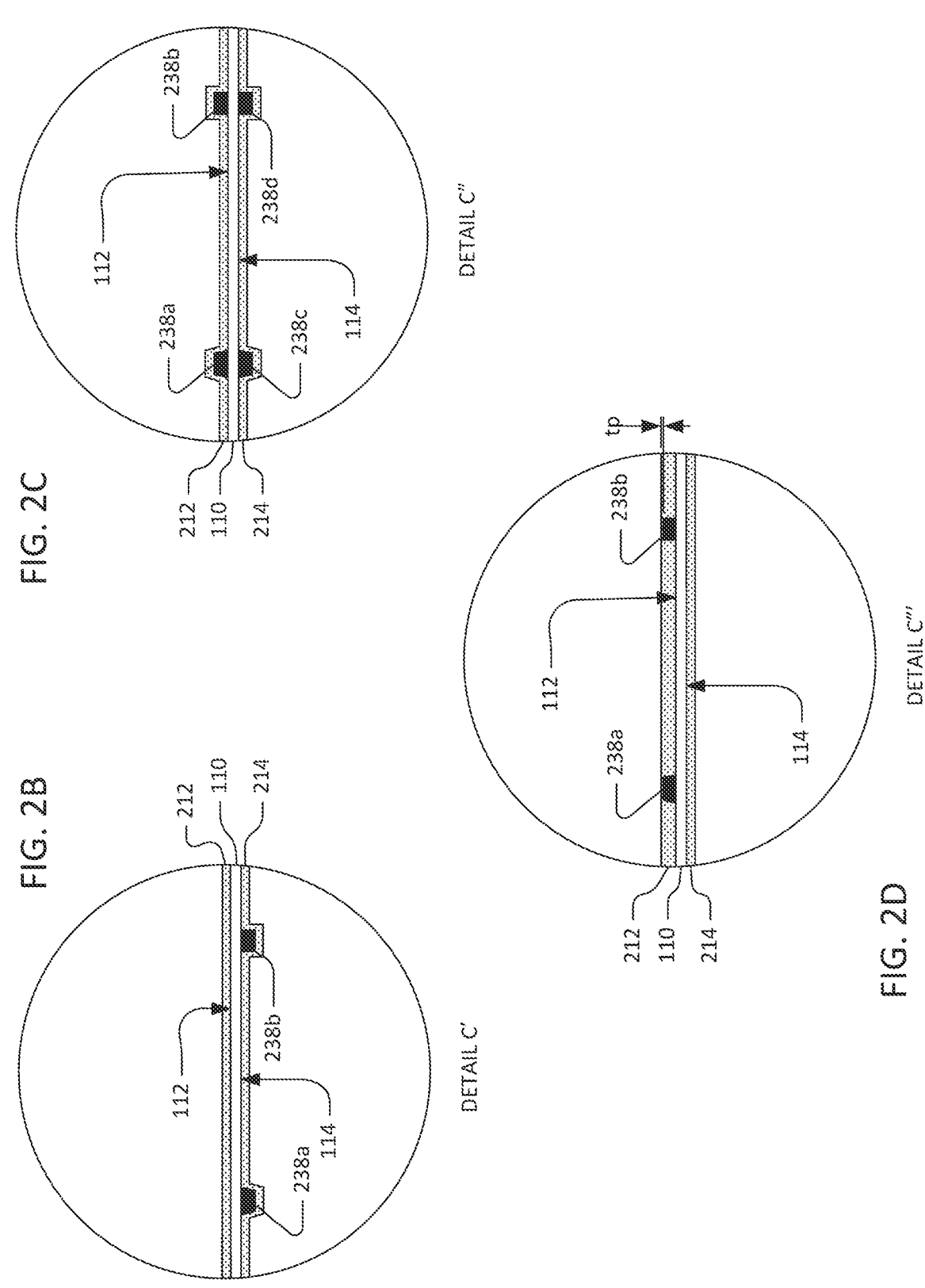
FIG. 2B is an expanded schematic cross-sectional view of an alternative configuration of the XBAR of FIG. 1.
FIG. 2C is an expanded schematic cross-sectional view of another alternative configuration of the XBAR of FIG. 1.
FIG. 2D is an expanded schematic cross-sectional view of another alternative configuration of the XBAR of FIG. 1.

Dimension p is the center-to-center spacing between adjacent IDT fingers, such as the IDT fingers 238*a*, 238*b* in FIGS. 2A, 2B, and 2C. The center-to-center spacing may be constant over the length of the IDT, in which case the dimension p may be referred to as the pitch of the IDT and/or the pitch of the XBAR. The center-to-center spacing may vary along the length of the IDT, in which case the pitch of the IDT is the average value of dimension p over the length of the IDT. Each IDT finger, such as the IDT fingers 238*a*, 238*b* in FIGS. 2A, 2B, and 2C, has a width w measured normal to the long direction of each finger. The width w may also be referred to herein as the "mark." The width of the IDT fingers may be constant over the length of the IDT, in which case the dimension w is the width of each IDT finger. The width of individual IDT fingers may vary along the length of the IDT 130, in which case dimension w is the average value of the widths of the IDT fingers over the length of the IDT. Note that the pitch p and the width w of the IDT fingers are measured in a direction parallel to the length L of the IDT, as defined in FIG. 1.

The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e., the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric plate 110. Moreover, the width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, less than, greater than, or any combination thereof, the thickness tm of the IDT fingers.

Moreover, unlike a SAW filter, the resonance frequency of an XBAR is dependent on the total thickness of its diaphragm (i.e., in the vertical or thickness direction), including the piezoelectric plate 110, and the front-side and back-side dielectric layers 212, 214 disposed thereon. As described in more detail below, the thickness of one or both dielectric layers can be varied to change the resonance frequencies of various XBARs in a filter. For example, shunt resonators in a ladder filter circuit may incorporate thicker dielectric layers to reduce the resonance frequencies of the shunt resonators relative to series resonators with thinner dielectric layers, and, thus a thinner overall thickness.

Thus, as will be described in detail below, a filter device including a plurality of acoustic resonators and a method for manufacturing the same is provided for applying a single dielectric coating (e.g., SiO$_2$ or SiN) on the front-side of the diaphragm to initially provide a plurality of resonators on the same die. The single dielectric coating can then be etched (or otherwise removed) to form different binary dielectric layer thicknesses after etching for different resonators, and, thus the same filter device can be manufactured with a plurality of acoustic resonators operating at different resonance frequencies due to the different configurations of passivation layers over each resonator, respectively. As a result, the acoustic resonator device and a method for manufacturing the same described below make it unnecessary to use more than two thicknesses of a dielectric layer to differentiate resonator characteristics. As will become apparent from the description below, by implementing a patterned dielectric layer of two thickness, a minimum thickness and a maximum thickness, reduces the manufacturing cost and complexity, and increasing yield. That is, a stepped binary dielectric layer thickness can be lithographically patterned to create any number of different desired effective thicknesses from a single masking and etching step, as described below.

Referring back to FIG. 2A, the thickness tfd of the front-side dielectric layer 212 over the IDT fingers 238*a*, 238*b* may be greater than or equal to a minimum thickness required to deal and passivate the IDT fingers and other conductors on the front side 112 to the piezoelectric plate 110. The minimum thickness may be, for example, 10 nm to 50 nm depending on the material of the front side dielectric layer and method of deposition according to an exemplary aspect. The thickness of the back-side dielectric layer 214 may be configured to specific thickness to adjust the resonance frequency of the resonator as will be described in more detail below.

Although FIG. 2A discloses a configuration in which IDT fingers 238a and 238b are on the front side 112 of the piezoelectric plate 110, alternative configurations can be provided. For example, FIG. 2B shows an alternative configuration in which the IDT fingers 238a, 238b are on the back side 114 of the piezoelectric plate 110 and are covered by a back-side dielectric layer 214. A front side dielectric layer 212 may cover the front side 112 of the piezoelectric plate 110. As described below, a dielectric layer disposed on the diaphragm of each resonator can be trimmed or etched to adjust the resonant frequency. However, if the dielectric layer is on the side of the diaphragm facing the cavity, there may be a change in spurious modes (e.g., generated by the coating on the fingers), which would need to be addressed. Moreover, with the passivation layer coated on top of the IDTs, the mark changes, which can also cause spurs. Therefore, disposing the IDT fingers 238a, 238b on the back side 114 of the piezoelectric plate 110 as shown in FIG. 2B may eliminate the need to address both the change in frequency as well as the effect it has on spurs as compared when the IDT fingers 238a and 238b are on the top front side 112 of the piezoelectric plate 110.

FIG. 2C shows an alternative configuration in which IDT fingers 238a, 238b are on the front side 112 of the piezoelectric plate 110 and are covered by a front-side dielectric layer 212. IDT fingers 238c, 238d are on the back side 114 of the piezoelectric plate 110 and are covered by a back-side dielectric layer 214. As previously described, the front-side and back-side dielectric layer 212, 214 are not necessarily the same thickness or the same material.

FIG. 2D shows another alternative configuration in which IDT fingers 238a, 238b are on the front side 112 of the piezoelectric plate 110 and are covered by a front-side dielectric layer 212. The surface of the front-side dielectric layer is planarized. The front-side dielectric layer may be planarized, for example, by polishing or some other method. A thin layer of dielectric material having a thickness tp may cover the IDT finger 238a, 238b to seal and passivate the fingers. The dimension TP may be, for example, 10 nm to 50 nm.

FIG. 3A and FIG. 3B show two alternative cross-sectional views along the section plane A-A defined in FIG. 1. In FIG. 3A, a piezoelectric plate 310 is attached to a substrate 320, which can correspond to substrate 120 of FIG. 1. Moreover, a cavity 340, which does not fully penetrate the substrate 320, is formed in the substrate under the portion of the piezoelectric plate 310 containing the IDT of an XBAR. The cavity 340 can correspond to cavity 140 of FIG. 1 in an exemplary aspect. In an exemplary aspect, the cavity 340 may be formed, for example, by etching the substrate 320 before attaching the piezoelectric plate 310. Alternatively, the cavity 340 may be formed by etching the substrate 320 with a selective etchant that reaches the substrate through one or more openings provided in the piezoelectric plate 310.

FIG. 3B illustrates an alternative aspect in which the substrate 320 includes a base 322 and an intermediate layer 324 that is disposed between the piezoelectric plate 310 and the base 322. For example, the base 322 may be silicon and the intermediate layer 324 may be silicon dioxide or silicon nitride or some other material, e.g., an intermediate dielectric layer. That is, in this aspect, the base 322 and the intermediate layer 324 are collectively considered the substrate 320. Although not shown in FIG. 3B, the substrate 320 may include more than one intermediate layer between the base 322 and the piezoelectric plate 310. As further shown, cavity 340 is formed in the intermediate layer 324 under the portion of the piezoelectric plate 310 containing the IDT fingers of an XBAR. The cavity 340 may be formed, for example, by etching the intermediate layer 324 before attaching the piezoelectric plate 310. Alternatively, the cavity 340 may be formed by etching the intermediate layer 324. In some cases, the etching may be performed with a selective etchant that reaches the substrate through one or more openings (not shown) provided in the piezoelectric plate 310. In this case, the diaphragm 315, which can correspond to diaphragm 115 of FIG. 1 in an exemplary aspect, may be contiguous with the rest of the piezoelectric plate 310 around a large portion of a perimeter of the cavity 340. For example, the diaphragm 315 may be contiguous with the rest of the piezoelectric plate 310 around at least 50% of the perimeter of the cavity 340. As shown in FIG. 3B, the cavity 340 extends completely through the intermediate layer 324. That is, the diaphragm 315 can have an outer edge that faces the piezoelectric plate 310 with at least 50% of the edge surface of the diaphragm 315 coupled to the edge of the piezoelectric plate 310 facing the diaphragm 315. This configuration provides for increased mechanical stability of the resonator.

In other configurations, the cavity 340 may extend into, but not though the intermediate layer 324 (i.e., the intermediate layer 324 may extend over the bottom of the cavity on top of the base 322), or may extend through the intermediate layer 324 into the base 322.

Figure 4:
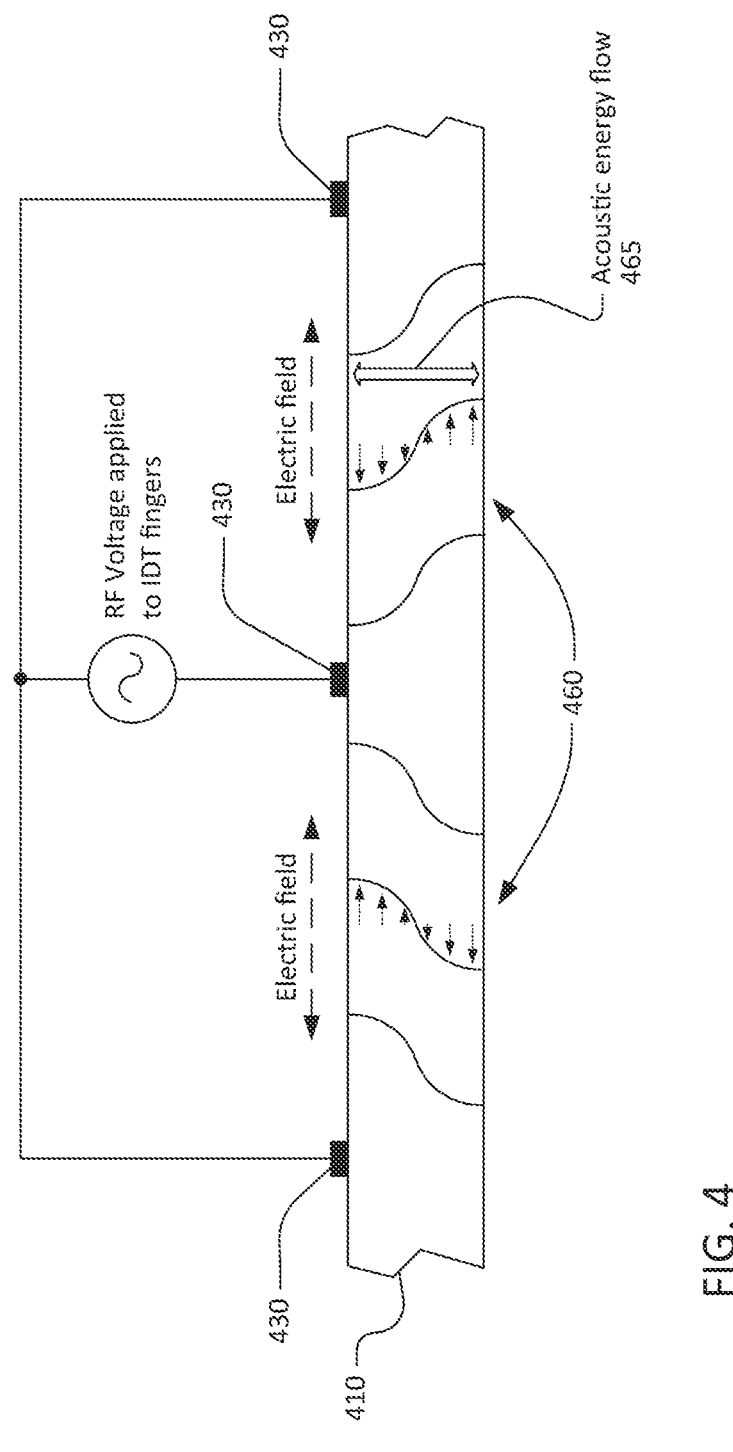
FIG. 4 is a graphic illustrating a shear horizontal acoustic mode in an XBAR.

FIG. 4 is a graphical illustration of the primary acoustic mode of interest in an XBAR. FIG. 4 shows a small portion of an XBAR 400 including a piezoelectric plate 410 and three interleaved IDT fingers 430. In general, the exemplary configuration of XBAR 400 can correspond to any of the configurations described above and shown in FIGS. 2A to 2D according to an exemplary aspect. Thus, it should be appreciated that piezoelectric plate 410 can correspond to piezoelectric plate 110 and IDT fingers 430 can be implemented according to any of the configurations of fingers 238a and 238b, for example.

In operation, an RF voltage is applied to the interleaved fingers 430. This voltage creates a time-varying electric field between the fingers. The direction of the electric field is lateral, or parallel to the surface of the piezoelectric plate 410, as indicated by the arrows labeled "electric field". Due to the high dielectric constant of the piezoelectric plate 410, the electric field is highly concentrated in the plate relative to the air. The lateral electric field introduces shear deformation in the piezoelectric plate 410, and thus strongly excites a shear-mode acoustic mode, in the piezoelectric plate 410. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 400 are represented by the curves 460, with the adjacent small arrows providing a schematic indication of the direction and magnitude of atomic motion. It is noted that the degree of atomic motion, as well as the thickness of the piezoelectric plate 410, have been exaggerated for ease of visualization in FIG. 4. While the atomic motions are predominantly lateral (i.e., horizontal as shown in FIG. 4), the direction of acoustic energy flow of the excited primary shear acoustic mode is substantially orthogonal to the surface of the piezoelectric plate, as indicated by the arrow 465.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. Thus, high piezoelectric coupling enables the design and implementation of microwave and millimeter-wave filters with appreciable bandwidth.

Figure 5:
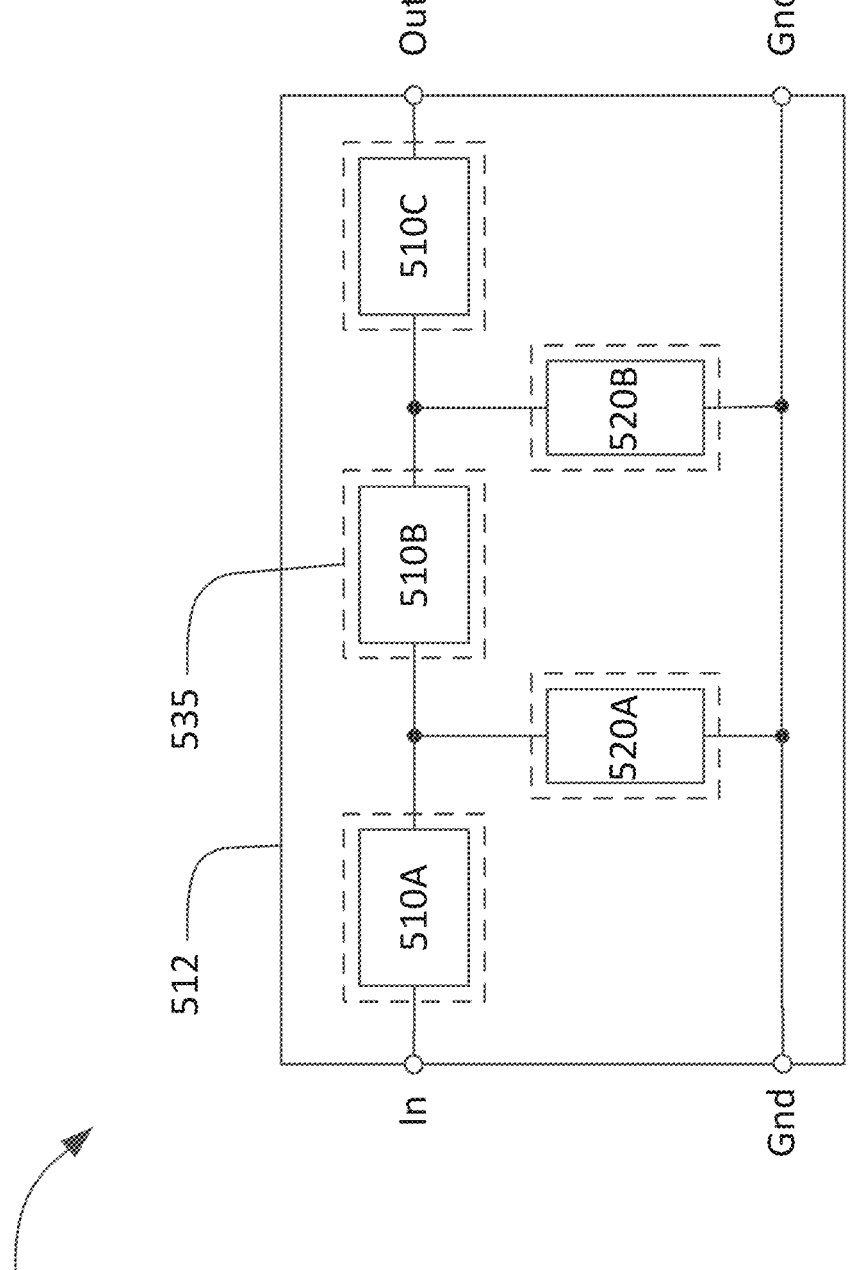
FIG. 5 is a schematic block diagram of a filter using XBAR resonators of FIG. 1.

FIG. 5 is a schematic circuit diagram and layout for a high frequency band-pass filter 500 using XBAR resonators, such as the XBAR 100 discussed above in reference to FIG. 1. The filter 500 has a ladder filter architecture including three series resonators 510A, 510B, 510C and two shunt resonators 520A, 520B. As shown, the three series resonators 510A, 510B, and 510C are connected in series between a first port and a second port. In FIG. 5, the first and second ports are labeled "In" and "Out", respectively. However, the filter 500 is bidirectional and either port and serve as the input or output of the filter. The two shunt resonators 520A, 520B are connected from nodes between the series resonators to ground. All the shunt resonators and series resonators are XBARs on a single die.

In an exemplary aspect, the three series resonators 510A, B, C and the two shunt resonators 520A, B of the filter 500 are formed on a single plate 512 of piezoelectric material bonded to a silicon substrate (not visible). The series and shunt resonators 510A, 510B, 510C, 520A, 520B all have a bonding layer formed on a plate of piezoelectric material. The three series resonators 510A, B, C and the two shunt resonators 520A, B have one or more plates of piezoelectric material bonded to the bonding layer. As will be described in more detail below, the passivation distributions can be different on respective resonators to vary the resonance frequency during operation. In general, series resonators, such as series resonators 510A, B, C, will have a thinner (or less) passivation distribution (e.g., a greater amount of the dielectric material is etched away by the mask pattern) where the shunt resonators, such as shunt resonators 520A, B) will have a thicker (or greater) passivation distribution (e.g., a lower amount of the dielectric material is etched away by the mask pattern).

Each resonator includes a respective IDT (not shown), such as the IDT 130 of FIG. 1, with at least the fingers of the IDT disposed over a cavity, such as the cavity 140 in the substrate 120 of FIG. 1, and at or on at least one surface of the piezoelectric material, such as the piezoelectric material 110 of FIG. 1. In this and similar contexts, the term "respective" means "relating things each to each," which is to say with at least a one-to-one correspondence. In FIG. 5, the cavities are illustrated schematically as the dashed rectangles (such as the rectangle 535). In this example, each IDT is disposed over a respective cavity. In other filters, the IDTs of two or more resonators may be disposed over a single cavity. Moreover, according to an exemplary aspect as described as follows, two or more of the plurality of the three series resonators 510A, B, C and the two shunt resonators 520A, B of the filter 500 can have passivation layer configurations on the IDT structure. This configuration provides for the respective resonators to operate at different resonant frequencies while also minimizing the manufacturing process to create such filter 500.

In particular, FIGS. 6A, 6B, 6C, 6D, 7A, 7B, 8A and 8B illustrate exemplary resonators of the filter 500 illustrated in FIG. 5 according to an exemplary aspect. That is, filter 500 can be composed of two or more of the resonators described below according to various exemplary aspects.

In this context, FIGS. 6A, 6B, 6C and 6D are schematic plan views of exemplary XBAR resonators. The conductor pattern of each XBAR 600A, 600B, 600C and 600D each include an IDT (as described above). The IDT includes a first plurality of parallel fingers 638a extending from a first busbar 632 and a second plurality of fingers 638b extending from a second busbar 634. The first and second pluralities of parallel fingers are interleaved. Such configurations can generally correspond to the IDT structures described above with respect to FIGS. 1 and 2. That is, first busbar 632 and second busbar 634 can correspond to first busbar 132 and second busbar 134 of FIG. 1. Moreover, parallel fingers 638a and 638b can correspond to parallel fingers 238a and 238b, respectively.

According to an exemplary aspect, each XBAR 600A, 600B, 600C and 600D, initially includes a uniform dielectric coating 680 (e.g., SiO2 or SiN) placed as a blanket over the IDT. In another words, an initial dielectric coating 680 having a uniform thickness is deposited over at least the IDTs and diaphragm of each XBAR. In an exemplary aspect, the initial dielectric coating 680 can also be planarized across the top surface opposite the IDT structure. Moreover, while the dielectric coating 680 is shown to be on a top or upper surface of the diaphragm (e.g., upper surface 112 as described above), in another exemplary aspect, the dielectric coating 680 may be disposed on a surface opposite the IDT structure, such as a backside coating layer. In this aspect, the dielectric coating 680 would not need to be planarized since there is no conforming effect by the IDT structure since the backside surface of the diaphragm is already planar or flat when the dielectric coating 680 is deposited.

In either event, during the manufacture process, as described below, the uniform dielectric coating 680 is etched to form a plurality of patterns 690a-690c for each resonator, respectively. In other words, the uniform dielectric coating 680 can be etched with different patterns (e.g., at least two patterns) to provide different passivation distributions of the coating layers of each resonator, resulting in different resonant frequencies for each such resonator. In an exemplary aspect, a single mask may be implemented during the selective etching process to generate a specific desired pattern in the uniform dielectric coating 680. In one aspect of the disclosure, the binary passivation distribution formed from the uniform dielectric coating 680 can be considered to have a first thickness with the etched pattern 690 having a second thickness. The second thickness will inherently be less than the first thickness since that part of the uniform dielectric coating 680 has been removed by the etching process.

In general, the greater the amount of the uniform dielectric coating 680 that is removed or etched away to create the etched pattern 690, the higher frequency of resonator. For example, the lowest frequency resonator illustrated in FIGS. 6A, 6B, 6C and 6D is 600D, and the highest is 600A. Thus, resonator 600D may be a one of shunt resonators 520A and/or 520B whereas resonator 600A may be a one of series resonators 510A, 510B and/or 510C in an exemplary aspect. Advantageously, the manufacturer (or filter designer) can select the desired pattern for etching the uniform dielectric coating 680 in order to adjust and customize the frequency of each resonator for a particular filter, for example. Thus, each of resonators 600A, 600B, 600C and 600D has a binary passivation distribution that includes a uniform lower layer (i.e., the lower portion of dielectric coating 680 that has been etched) and an upper layer (or distribution) of the dielectric coating 680 that has not been etched. This upper distribution of dielectric coating 680 varies according to the pattern and thus varies the percentage of coverage over the lower layer.

Moreover, it should be appreciated that while the binary passivation distribution thicknesses are described as two separate "layers", the dielectric coating material 680 is formed as a single continuous material of dielectric material according to the exemplary aspect. In the exemplary aspect, the filter device is provided to include at least two resonators (e.g., one or more series resonators and also one or more shunt resonators), where for at least two resonators of the plurality of resonators, the dielectric layer has a binary thickness distribution that includes a first thickness layer and a second thickness layer over the first thickness layer. In this aspect, the second thickness layer of a first resonator of the resonators has a coverage distribution over the first thickness layer that is different than a coverage distribution of a second resonator of the resonators. Moreover, while the exemplary dielectric distribution is described as a "binary" thickness distribution (e.g., a base layer and dielectric pattern formed thereon by etching), it should be appreciated that the exemplary resonators can be formed to have a tertiary (or greater) distribution, although this will increase the number of etching steps as would be appreciated to one skilled in the art.

Thus, in this aspect and as described throughout the specification, uniform dielectric coating means a consistent application of the dielectric coating across the IDT, where the upper surface that is opposite the diaphragm surface (and IDT structure) can be planarized for each resonator, for example. Moreover, the dielectric coating may be one of SiO2 or SiN according to exemplary aspects. The uniform dielectric coating is then patterned to form different distributions that adjust the resonant frequency of each respective resonator.

Figure 7B:
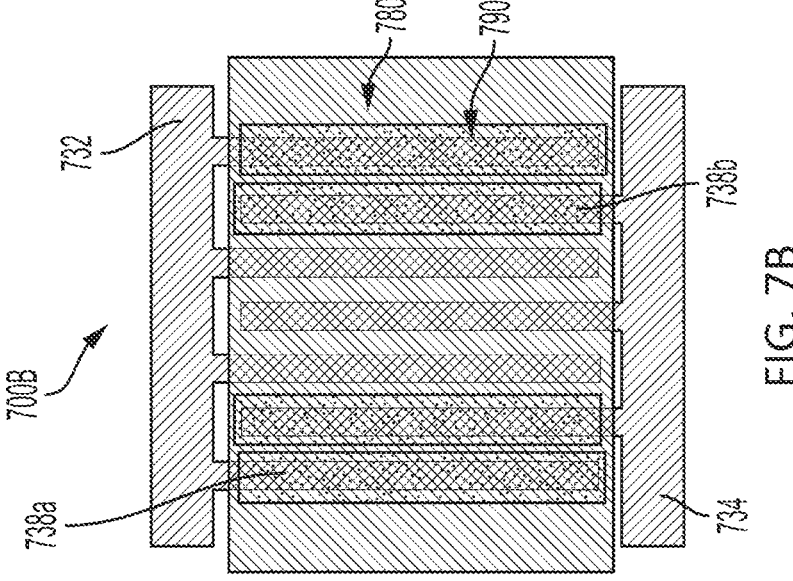
FIGS. 7A and 7B are schematic plan views of exemplary XBAR resonators according to exemplary aspects.
Figure 7A:
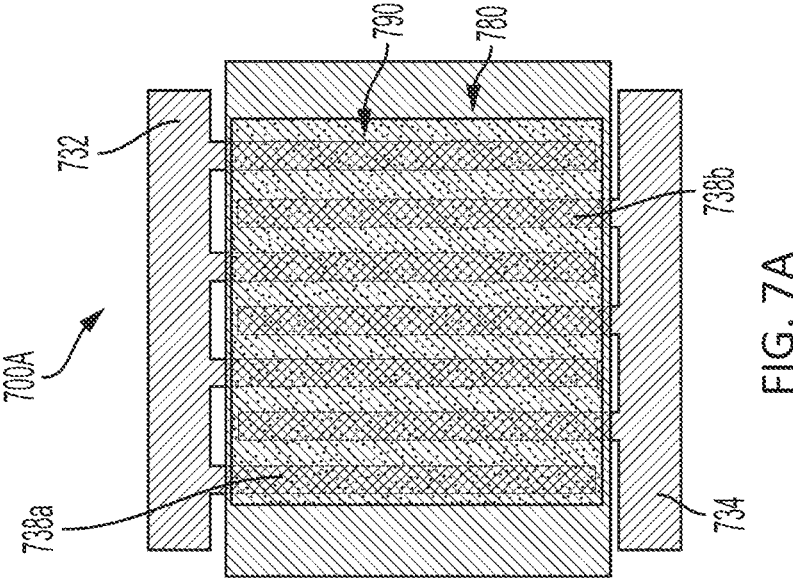

FIGS. 7A and 7B are schematic plan views of exemplary XBAR resonators. As shown, the conductor pattern of each XBAR 700A and 700B each include an IDT (as described above). The IDT includes a first plurality of parallel fingers 738*a* extending from a first busbar 732 and a second plurality of fingers 738*b* extending from a second busbar 734. The first and second pluralities of parallel fingers are interleaved of which such configurations can generally correspond to the IDT structures described above with respect to FIGS. 1 and 2. That is, first busbar 732 and second busbar 734 can correspond to first busbar 132 and second busbar 134 of FIG. 1. Moreover, parallel fingers 738*a* and 738*b* can correspond to parallel fingers 238*a* and 238*b*, respectively.

According to an exemplary aspect, each XBAR 700A and 700B, initially includes a uniform dielectric coating 780 (e.g., SiO2 or SiN) placed as a blanket over the IDT. In another words, an initial dielectric coating 780 having a uniform thickness is deposited over at least the IDTs and diaphragm of each XBAR. In an exemplary aspect, the initial dielectric coating 780 can also be planarized across the top surface opposite the IDT structure. Moreover, while the dielectric coating 780 is shown to be on a top or upper surface of the diaphragm (e.g., upper surface 112 as described above), in another exemplary aspect, the dielectric coating 780 may be disposed on a surface opposite the IDT structure, such as a backside coating layer. In this aspect, the dielectric coating 780 would not need to be planarized since there is no conforming effect by the IDT structure since the backside surface of the diaphragm is already planar or flat when the dielectric coating 780 is deposited.

In either event, during the manufacture process, as described below, the uniform dielectric coating 780 is etched to form a plurality of patterns 790*a*-790*b* for each resonator, respectively. In other words, the uniform dielectric coating 780 can be etched with different patterns (e.g., at least two patterns) to provide different passivation distributions of the coating layers of each resonator, resulting in different resonant frequencies for each such resonator. In an exemplary aspect, a single mask may be implemented during the selective etching process to generate a specific desired pattern in the uniform dielectric coating 780. In one aspect of the disclosure, the binary passivation distribution formed from the uniform dielectric coating 780 can be considered to have a first thickness with the etched pattern 790 having a second thickness. The second thickness will inherently be less than the first thickness since that part of the uniform dielectric coating 780 has been removed by the etching process.

In general, the greater the amount of the uniform dielectric coating 780 that is removed or etched away to create the etched pattern 790, the higher frequency of resonator. For example, the lowest frequency resonator illustrated in FIGS. 7A and 7B is 700B, and the highest is 700A. Thus, resonator 700B may be a one of shunt resonators 520A and/or 520B whereas resonator 700A may be a one of series resonators 510A, 510B and/or 510C in an exemplary aspect. Advantageously, the manufacturer (or filter designer) can select the desired pattern for etching the uniform dielectric coating 780 in order to adjust and customize the frequency of each resonator for a particular filter, for example. Thus, each of resonators 700A and 700B has a binary passivation distribution that includes a uniform lower layer (i.e., the lower portion of dielectric coating 780 that has been etched) and an upper layer (or distribution) of the dielectric coating 780 that has not been etched. This upper distribution of dielectric coating 780 varies according to the pattern and thus varies the percentage of coverage over the lower layer.

Figures 8A, 8B:
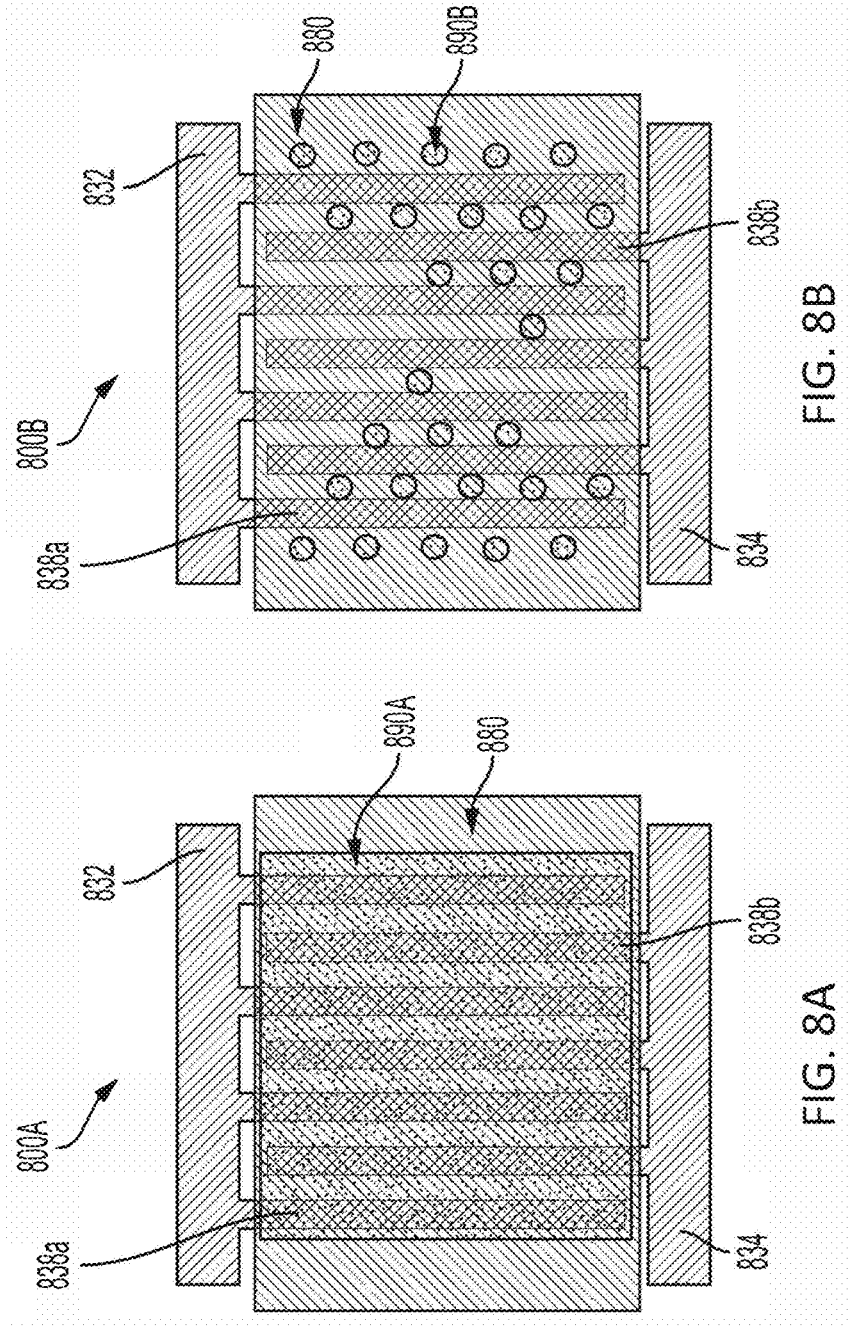
FIGS. 8A and 8B are schematic plan views of exemplary XBAR resonators according to exemplary aspects.

FIGS. 8A and 8B are schematic plan views of exemplary XBAR resonators. The conductor pattern of each XBAR 800A and 800B each include an IDT (as described above). The IDT includes a first plurality of parallel fingers 838*a* extending from a first busbar 832 and a second plurality of fingers 838*b* extending from a second busbar 834. The first and second pluralities of parallel fingers are interleaved. Such configurations can generally correspond to the IDT structures described above with respect to FIGS. 1 and 2. That is, first busbar 832 and second busbar 834 can correspond to first busbar 832 and second busbar 134 of FIG. 1. Moreover, parallel fingers 838*a* and 838*b* can correspond to parallel fingers 238*a* and 238*b*, respectively.

According to an exemplary aspect, each XBAR 800A and 800B, initially includes a uniform dielectric coating 880 (e.g., SiO2 or SiN) placed as a blanket over the IDT. In other words, an initial dielectric coating 880 having a uniform thickness is deposited over at least the IDTs and diaphragm of each XBAR. In an exemplary aspect, the initial dielectric coating 880 can also be planarized across the top surface opposite the IDT structure. Moreover, while the dielectric coating 880 is shown to be on a top or upper surface of the diaphragm (e.g., upper surface 112 as described above), in another exemplary aspect, the dielectric coating 880 may be disposed on a surface opposite the IDT structure, such as a backside coating layer. In this aspect, the dielectric coating 880 would not need to be planarized since there is no conforming effect by the IDT structure since the backside surface of the diaphragm is already planar or flat when the dielectric coating 880 is deposited.

In either event, during the manufacture process, as described below, the uniform dielectric coating 880 is etched to form a plurality of patterns 890a-890b for each resonator, respectively. In other words, the uniform dielectric coating 880 can be etched with different patterns (e.g., at least two patterns) to provide different passivation distributions of the coating layers of each resonator, resulting in different resonant frequencies for each such resonator. In an exemplary aspect, a single mask may be implemented during the selective etching process to generate a specific desired pattern in the uniform dielectric coating 880. In one aspect of the disclosure, the binary passivation distribution formed from the uniform dielectric coating 880 can be considered to have a first thickness with the etched pattern 890 having a second thickness. The second thickness will inherently be less than the first thickness since that part of the uniform dielectric coating 880 has been removed by the etching process.

In general, the greater the amount of the uniform dielectric coating 880 that is removed or etched away to create the etched pattern 890, the higher frequency of resonator. For example, the lowest frequency resonator illustrated in FIGS. 8A and 8B is 800B, and the highest is 800A. Thus, resonator 800B may be a one of shunt resonators 520A and/or 520B whereas resonator 800A may be a one of series resonators 510A, 510B and/or 510C in an exemplary aspect. Advantageously, the manufacturer (or filter designer) can select the desired pattern for etching the uniform dielectric coating 880 in order to adjust and customize the frequency of each resonator for a particular filter, for example. Thus, each of resonators 800A and 800B has a binary passivation distribution that includes a uniform lower layer (i.e., the lower portion of dielectric coating 880 that has been etched) and an upper layer (or distribution) of the dielectric coating 880 that has not been etched. This upper distribution of dielectric coating 880 varies according to the pattern and thus varies the percentage of coverage over the lower layer.

Figures 6A, 6B, 6C, 6D:
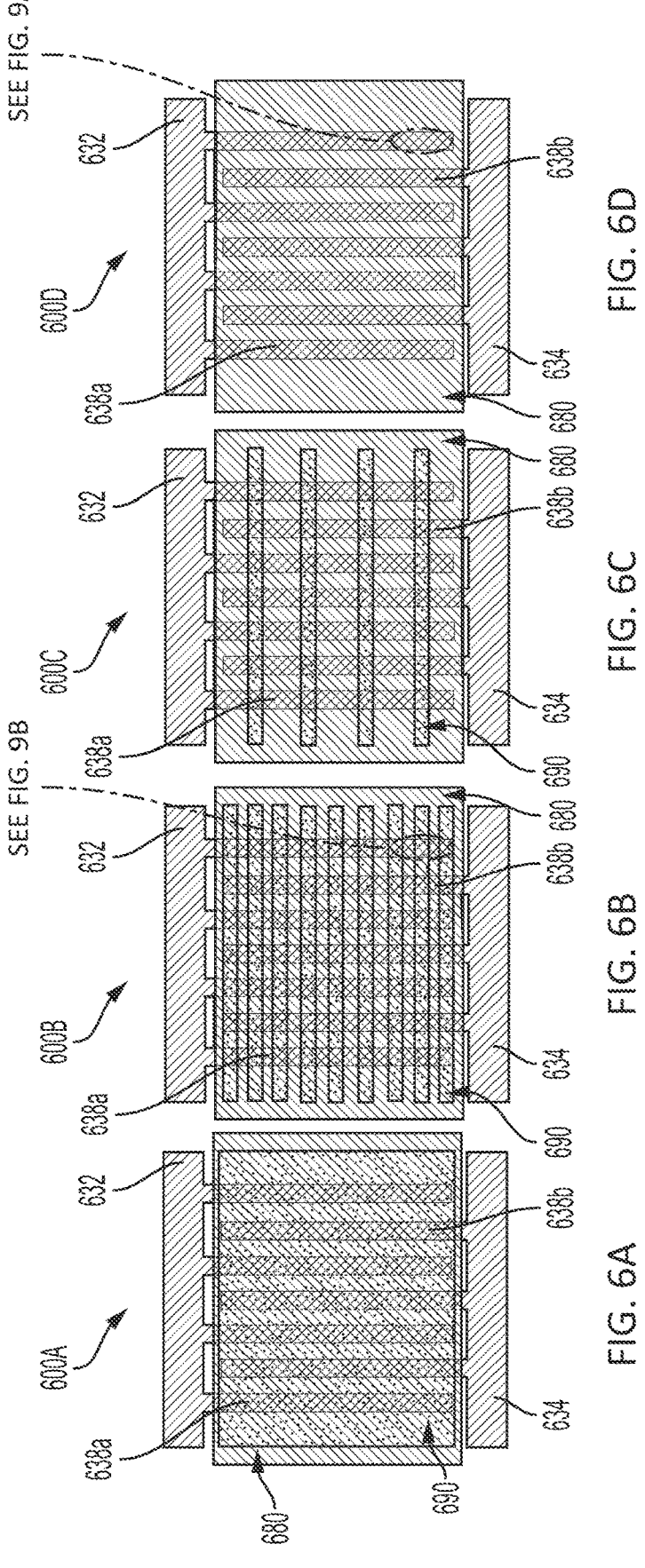
FIGS. 6A, 6B, 6C and 6D are schematic plan views of exemplary XBAR resonators according to exemplary aspects.

Specifically, as illustrated in the figures, different etching patterns are provided, for example, linear lines, circular holes, and patterns which can sustainably mirror the shape of individual IDT fingers or the entire IDT. For example, FIGS. 6B and 6C illustrate patterns of etching which are linear stripes in a horizontal orientation with relation to the length of the resonator (and orthogonal to the direction in which the interleaved fingers extend). In another aspect, for example, FIG. 7B illustrates a pattern of etching which are linear stripes in a vertical orientation with relation to the length of the resonator. Based on these differing configurations, it should be appreciated that the specific etching pattern is not so limited as long as the pattern used to etch the dielectric material is different between at least two resonators, which results in a varying coverage distribution of the passivation layer and thus different resonant frequencies.

Figures 9A, 9B:
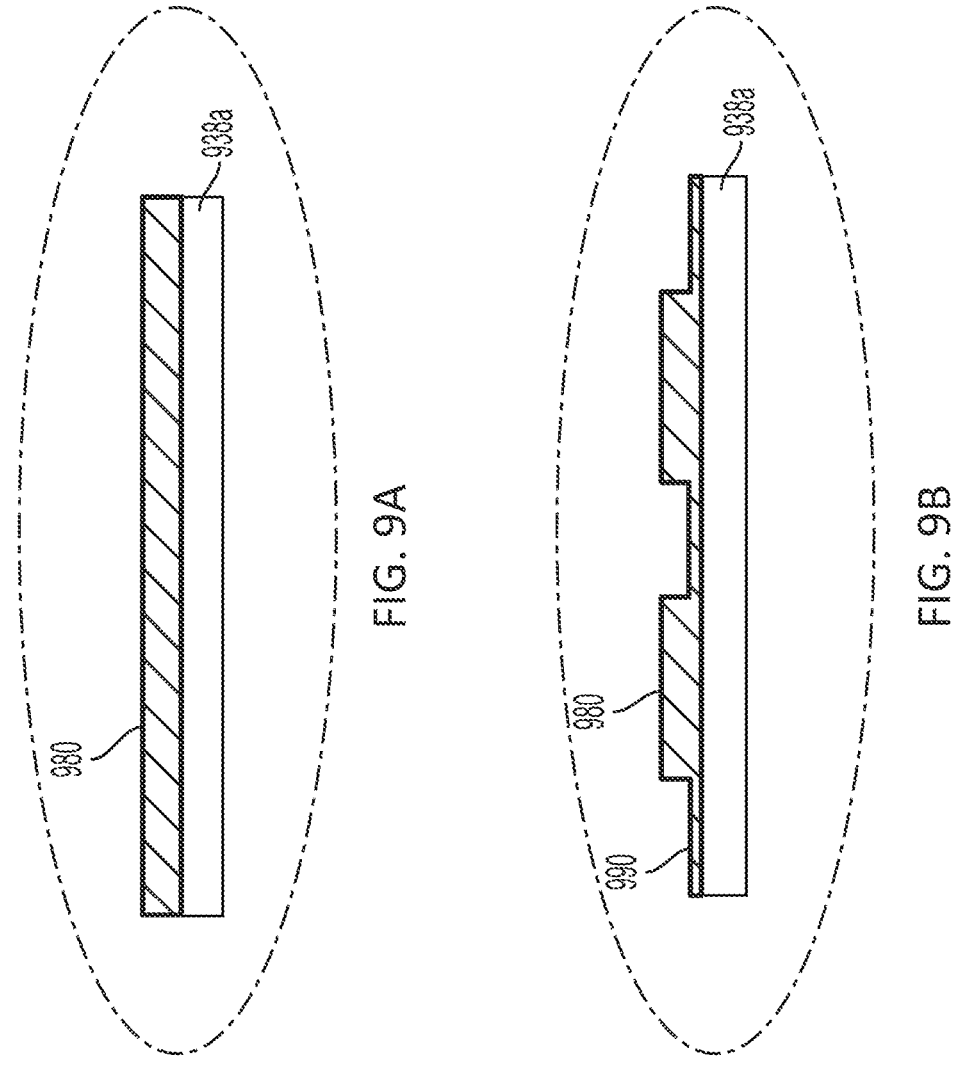
FIG. 9A is an expanded schematic cross-sectional view of the XBAR resonator shown in FIG. 6D.
FIG. 9B is an expanded schematic cross-sectional view of XBAR resonator shown in FIG. 6B.

FIG. 9A is an expanded schematic cross-sectional view of an acoustic resonator configured from the etching pattern of FIG. 6D. FIG. 9B is an expanded schematic cross-sectional view of a acoustic resonator configured by the etching pattern of FIG. 6B.

Referring to FIG. 9A, a single finger 938a of the IDT (corresponding to finger 638A) of resonator 600D is illustrated along with the uniform dielectric coating layer 980. The uniform dielectric coating layer 980 coats the entire IDT or nearly the entire IDT, for example at a 100% thickness, on the single finger 938a. Thus, it should be appreciated that during manufacture, the dielectric coating layer 980 has first been applied to the diaphragm (and IDT structure) and then a mask has been applied that covers the entire dielectric coating layer 980. As a result, when the etching step is performed (as discussed below) none of dielectric coating layer 980 is actually etched for this respective resonator. This may be used as a shunt resonator for filter 500 according to an exemplary aspect as described above.

Referring to FIG. 9B, a single finger 938a of the IDT (corresponding to finger 638A) of resonator 600B is illustrated along with the binary thickness dielectric coating layer 980 and 990, respectively. In one aspect of the disclosure the different etched patterns may remove or alter the uniform thickness of dielectric coating layer 980. For example, the uniform dielectric coating layer 980 may be etched at a location on finger 938a to create the dielectric layer 990, for example, dielectric layer 990 may be etched to a 50% thickness compared to uniform dielectric layer 990. This effectively creates a different passivation distribution on resonator 600B (compared with resonator 600D, for example). Thus, it should be appreciated that the thickness of the etching may be adjusted based upon a desired frequency of the device. For example, the uniform dielectric coating layer 980 may be etched at a location on finger 938a to create the binary passivation distribution of resonator 600B (generally shown as a thicker dielectric layer 980 and a thinner dielectric layer 990).

Again, it should be appreciated that while the passive distribution is generally described as two layers of dielectric, effectively, each resonator has a first uniform layer with a distributed pattern of dielectric that is on top of the first layer and formed based on the specific etching pattern as described above, which can be designed to define the resonant frequency of each respective resonator. Moreover, the distributed passivation distribution is effectively a single and continuous dielectric material and while it is described in the exemplary aspects as being formed on top of the IDT structure at the diaphragm, the distributed passivation distribution can also be formed on a backside of the diaphragm (i.e., opposite the IDT structure) in an alternative embodiment.

Figure 10:
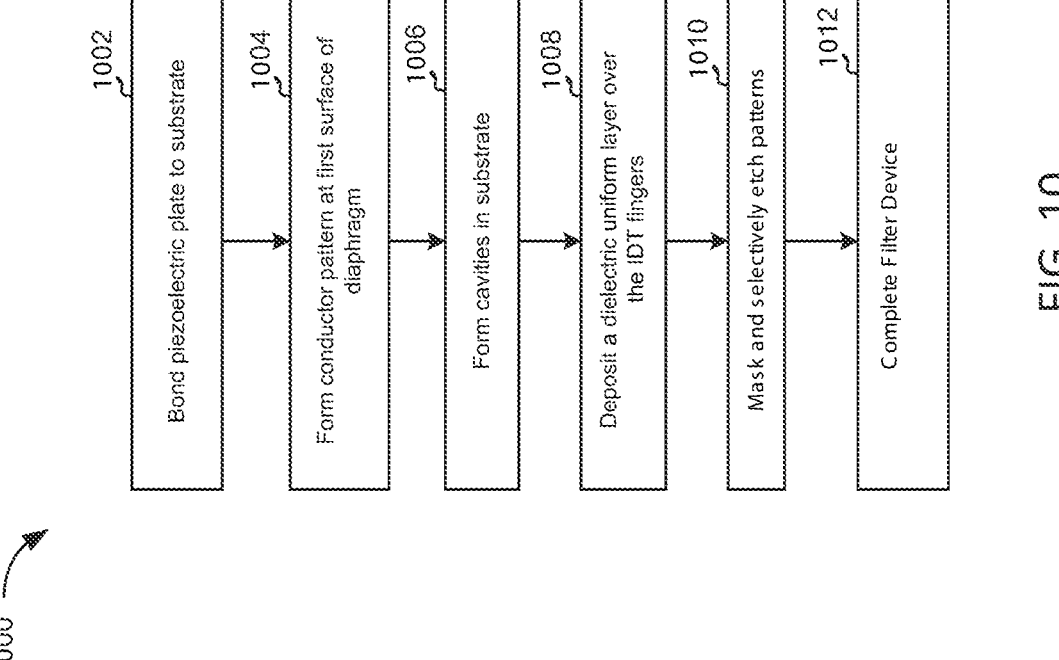
FIG. 10 illustrates a flowchart of a method of manufacturing an XBAR resonator as described herein according to an exemplary aspect.

FIG. 10 illustrates a flowchart of a method of manufacturing an XBAR or a filter including a dielectric layer with a different (e.g., binary) passivation thickness as described herein according to an exemplary aspect. As shown, the method 1000 starts at 1002 with a substrate and a plate of piezoelectric material and ends at 1012 with a completed XBAR or filter. The flow chart of FIG. 10 includes only major process steps for purposes of describing the exemplary manufacturing method. Various conventional process steps (e.g., surface preparation, cleaning, inspection, baking, annealing, monitoring, testing, etc.) may be performed before, between, after, and during the steps shown in FIG. 10, as would be appreciated to one skilled in the art.

The piezoelectric plate may be, for example, Z-cut lithium niobate or lithium tantalate as used in the previously presented examples. The piezoelectric plate may be some other material and/or some other cut. The substrate may preferably be silicon. The substrate may be some other material that allows formation of deep cavities by etching or other processing.

At 1002, the piezoelectric plate is bonded to the substrate. For a filter device, multiple piezoelectric plates may be bonded to the substrate, e.g., one for each resonator in an exemplary aspect. In any case, the piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

A variation of the process 1000 is to grow the piezoelectric plate in situ on the substrate. In that process variation, bonding is not required and the action at 1002 would be redefined as "grow piezoelectric plate on substrate."

At 1004, a conductor pattern is deposited or otherwise formed on a first surface of the diaphragm of the piezoelectric plate using a metal deposition and patterning one or more conductor layer on a first surface of the piezoelectric plate. A conductor layer may be, for example, aluminum, an aluminum alloy, copper, a copper alloy, or some other conductive metal. Optionally, one or more layers of other materials may be disposed below (i.e., between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 1004 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques. Alternatively, the conductor pattern may be formed using a lift-off process. Photoresist may be deposited over the piezoelectric plate. And patterned to define the conductor pattern. The conductor layer and, optionally, one or more other layers may be deposited in sequence over the surface of the piezoelectric plate. The photoresist may then be removed, which removes the excess material, leaving the conductor pattern.

At 1006, one or more cavities are formed in the substrate. A separate cavity may be formed for each resonator in a filter device. The one or more cavities may be formed using an anisotropic or orientation-dependent dry or wet etch to open holes from the back side of the substrate to the piezoelectric plate. Alternatively, cavities in the form of recesses in the substrate may be formed by etching the substrate using an etchant introduced through openings in the piezoelectric plate. It should be appreciated that the cavity can be formed before the conductor pattern is formed on the piezoelectric plate in an exemplary aspect. Moreover, another variation of the process 1000 is to form the one or more cavities in the substrate prior to attaching the piezoelectric plate to the substrate. In that process variation, the actions at 804 and 806 occur before the action at 1002.

At 1008, a front-side dielectric layer may be formed by depositing a layer of dielectric material on the first surface of the piezoelectric plate. The dielectric layer may be deposited using a conventional deposition technique such as sputtering, evaporation, or chemical vapor deposition. The dielectric layer may be deposited over the entire surface of the piezoelectric plate, including on top of the conductor pattern. The front-side dielectric layer can correspond to uniform dielectric coating 680 as described above. In an alternative aspect, the uniform dielectric coating 680 can be deposited on a back-side of the diaphragm as also described above.

In either event, at 1010, one or more lithography processes (using photomasks) may be used to adjust the thickness of the dielectric layer to selected areas, such as a pattern for each respective resonator. Masks may also be used to allow etching of different passivation distributions of the dielectric material for different resonators formed on the piezoelectric plate. The respective patterns create a particular dielectric layer with binary thickness distributions on each IDT of resonators on the same die. The etching process may include a single mask and a single etching step.

Thus, according to the manufacturing steps at 1008 and 1010, the dielectric layer of at least one first resonator of the plurality of resonators the form the filter has a binary thickness distribution (e.g., the first layer) that can be considered to include a dielectric base (e.g., uniform dielectric coating 680) that has a uniform or planar distribution (e.g., parallel to the surface of the diaphragm) and a first dielectric pattern disposed on the dielectric base. Similarly, the dielectric layer of at least one second resonator of the plurality of resonators has a binary thickness distribution that also includes a dielectric base having a uniform distribution and a second dielectric pattern on the dielectric base. Each of the dielectric base and the dielectric pattern are formed of a continuous dielectric material as described herein. Moreover, the first dielectric pattern is different than the second dielectric pattern, for example, as shown in each of resonators 600A to 600D.

In any event, after the etching of the pattern in the dielectric layer is complete, the filter device may be completed step 1012. Moreover, actions that may occur to complete the filter device may include depositing and patterning additional metal layers to form conductors other than the IDT conductor pattern; proceeding with other metal and oxide processing steps to complete resonator fabrication; depositing an encapsulation/passivation layer such as SiO2 or Si3O4 over all or a portion of the device; forming bonding pads or solder bumps or other means for making connection between the device and external circuitry; excising individual devices from a wafer containing multiple devices; other packaging steps; and testing.

As described above, by applying a single dielectric coating (e.g., SiO2 or SiN) on the front-side of the IDT provides a plurality of resonators on the same die with a different binary passivation distributions after etching. The acoustic resonator device and a method for manufacturing the same described above make it unnecessary to apply multiple dielectric layers to the different resonators to vary the respective thicknesses and thus differentiate resonator characteristics of each resonator of the filter device. Specifically, by implementing a mask with different patterns to form different dielectric distributions, e.g., a first thickness and a second thickness less than the first thickness, reduces the processing cost and complexity of the manufacturing process and simplifies the resulting structure of the filter device by minimizing the number of dielectric layers that would otherwise be needed to vary the resonant frequency of each resonator. As also described above, a stepped binary dielectric layer thickness can be lithographically patterned to create any number of different arbitrary effective uniform thicknesses from a single mask and a single etch.

The aspects described herein additionally include one or more of the following implementation examples described in the following numbered clauses.

In general, it is noted that throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, the pair of terms "top" and "bottom" can be interchanged with the pair "front" and "back". As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

What is claimed:

1. A filter device comprising:
a substrate having a surface;
at least one piezoelectric plate having a front surface and a back surface facing away the front surface and attached to the substrate;
a plurality of interdigital transducers (IDTs) of a plurality of resonators, respectively, each of the plurality of IDTs having a plurality of interleaved fingers on at least one surface of a respective diaphragm of a plurality of diaphragms of the at least one piezoelectric plate disposed over one or more cavities; and
at least one dielectric layer over the plurality of diaphragms and the front surface of the at least one piezoelectric plate;
wherein, for at least two resonators of the plurality of resonators, the at least one dielectric layer has a thickness distribution that includes a first thickness layer that is on and between the interleaved fingers of the respective IDTs of each of the at least two resonators and a second thickness layer over the first thickness layer, such that the first thickness layer of each of the at least two resonators is between the at least one piezoelectric plate and the second thickness layer of each of the at least two resonators, and
wherein the second thickness layer of a first resonator of the at least two resonators has a coverage distribution over the first thickness layer of the first resonator that is a different pattern in a plan view of the at least one piezoelectric plate than a pattern in the plan view of a coverage distribution of the second thickness layer over the first thickness layer of the second resonator of the at least two resonators,
wherein the first resonator comprises at least one shunt resonator and the second resonator comprises at least one series resonator, and
wherein a back-side dielectric layer is disposed on the back surface of the at least one piezoelectric plate of both the at least one shunt resonator and the at least one series resonator.

2. The filter device of claim 1, wherein a thickness from a top of the first thickness layer to the at least one piezoelectric plate is less than a thickness from a top of the second thickness layer to the at least one piezoelectric plate.

3. The filter device of claim 1, wherein an amount of dielectric material of the second thickness layer of each of at least two resonators is less than an amount of dielectric material of the first thickness layer of each of the at least two resonators.

4. The filter device of claim 1, wherein the pattern of the coverage distribution of the second thickness layer of the second resonator includes a different number of one or more linear stripes or a different thickness of the one or more linear stripes than the pattern of the coverage distribution of the second thickness layer of the first resonator.

5. The filter device of claim 1, wherein the at least one dielectric layer includes $SiO_2$.

6. The filter device of claim 1, wherein the plurality of resonators are arranged on a same die.

7. The filter device of claim 1, wherein the coverage distribution of the second thickness layer over the first thickness layer of the shunt resonator has a percentage of coverage on the first thickness layer that is different than a percentage of coverage of the coverage distribution of the second thickness layer on the first thickness layer of the series resonator.

8. The filter device of claim 1, wherein the pattern of the coverage distribution of the second thickness layer over the first thickness layer of the first resonator comprises an asymmetric distribution in the plan view with respect to a center portion of the first resonator.

9. The filter device of claim 1, wherein the plurality of IDTs are on a first surface of each of the plurality of diaphragms, respectively, and the at least one dielectric layer is on the plurality of IDTs.

10. The filter device of claim 1, wherein the first thickness layer and the second thickness layer over the first thickness layer of the at least one dielectric layer are formed of a single continuous dielectric material.

11. The filter device of claim 4, wherein at least one of the one or more linear stripes of the coverage distribution of the second thickness layer of each of the first resonator and the second resonator extend in a direction transverse to a direction in which at least one finger of the plurality of interleaved fingers extend of the respective IDTs of the first resonator and the second resonator.

12. A filter device comprising:
a substrate having a surface;
at least one piezoelectric plate having a front surface and a back surface facing away the front surface and attached to the substrate;
a plurality of interdigital transducers (IDTs) of a plurality of resonators, respectively, that each have a plurality of interleaved fingers on at least one surface of a respective diaphragm of a plurality of diaphragms of the at least one piezoelectric plate disposed over one or more cavities; and at least one dielectric layer over the plurality of diaphragms and the front surface of the at least one piezoelectric plate;

wherein the at least one dielectric layer of at least one first resonator of the plurality of resonators has a thickness distribution that includes a dielectric base having a uniform distribution and a first dielectric pattern on the dielectric base, such that the dielectric base of the at least one first resonator is between the interleaved fingers of the respective IDT and between the at least one piezoelectric plate and the first dielectric pattern of the at least one first resonator, wherein the at least one dielectric layer of at least one second resonator of the plurality of resonators has a thickness distribution that includes a dielectric base having a uniform distribution and a second dielectric pattern on the dielectric base, such that the dielectric base of the at least one second resonator is between the interleaved fingers of the respective IDT and between the at least one piezoelectric plate and the second dielectric pattern of the at least one first resonator, wherein the first dielectric pattern in a plan view of the at least one piezoelectric plate is a different pattern than the second dielectric pattern in the plan view, wherein the at least one first resonator comprises at least one shunt resonator and the at least one second resonator comprises at least one series resonator, and wherein a back-side dielectric layer is disposed on the back surface of the at least one piezoelectric plate of both the at least one shunt resonator and the at least one series resonator.

13. The filter device of claim 12, wherein the at least one dielectric layer includes $SiO_2$.

14. The filter device of claim 12, wherein the plurality of resonators are arranged on a same die.

15. The filter device of claim 12, wherein the first and second dielectric patterns include a different number of one or more linear stripes from each other or a different thickness of the one or more linear stripes from each other.

16. The filter device of claim 12, wherein the plurality of IDTs are on a first surface of each of the respective diaphragms and the at least one dielectric layer is on the plurality of IDTs.

17. The filter device of claim 12, wherein the dielectric base and the first dielectric pattern of the at least one first resonator is a single continuous dielectric material, and wherein the dielectric base and the second dielectric pattern of the at least one second resonator is a single continuous dielectric material.

* * * * *